(12) United States Patent
Feldman et al.

(10) Patent No.: US 8,938,036 B2
(45) Date of Patent: Jan. 20, 2015

(54) FAST AUTOMATIC GAIN CONTROL

(75) Inventors: Ariel Feldman, Raanana (IL); Udi Suissa, Raanana (IL)

(73) Assignee: DSP Group Ltd., Herzeliya (IL)

( * ) Notice: Subject to any disclaimer, the term of this patent is extended or adjusted under 35 U.S.C. 154(b) by 334 days.

(21) Appl. No.: 13/360,817

(22) Filed: Jan. 30, 2012

(65) Prior Publication Data
US 2013/0195230 A1 Aug. 1, 2013

(51) Int. Cl.
*H04L 27/08* (2006.01)

(52) U.S. Cl.
USPC .......................................... 375/345; 375/346

(58) Field of Classification Search
USPC .................................................. 375/345, 346
See application file for complete search history.

(56) References Cited

U.S. PATENT DOCUMENTS

| 2007/0076827 | A1* | 4/2007 | Beamish et al. | 375/345 |
| 2007/0287400 | A1* | 12/2007 | Yu et al. | 455/232.1 |
| 2010/0067622 | A1* | 3/2010 | Komaili et al. | 375/345 |

* cited by examiner

*Primary Examiner* — Qutbuddin Ghulamali
(74) *Attorney, Agent, or Firm* — Oren Reches

(57) ABSTRACT

A device and method of fast automatic gain control in quadrature receivers are disclosed. The AGC activity between the I and Q branches is split where in one branch the receive chain is in a certain gain state and in the other branch the receive chain is in another possible gain state, resulting in a significant shortening of the AGC duration of any IQ receiver.

21 Claims, 3 Drawing Sheets

FAST AUTOMATIC GAIN CONTROL

BACKGROUND

The present disclosure generally relates to the gain control of a signal in communication systems, and more specifically to the automatic gain control ("AGC") of a signal detected by a receiver.

To regulate the received signal strength, an adaptive and fundamental mechanism known as AGC is employed. For a weak or attenuated signal, AGC raises the receiver gain stages to bring the signal level to an acceptable signal to noise ratio. Should the received signal strength be strong, then AGC effectively reduces the receiver gain stages to avoid distortion or nonlinear degradations. AGC thus may enable proper reception in the presence of interferers/blockers, as well as bring the required signal to a linear region of reception for certain types of modulations. Stated differently, if done correctly, AGC increases the receiver's dynamic range, which is a critical parameter influencing the receiver's performance.

The details and complexity of the AGC mechanism are dependent on the relevant standard requirements, and the specific selected receiver architecture and its implementation. A wise AGC concept is one that not only complies with the standards, but also contributes to simpler and cost-efficient receiver architecture because time is a critical component to the reception process.

In particular, one of the main bottlenecks in the reception process is the limited amount of time budgeted to prepare the receiver for data reception. For example, in a relatively short period, the receiver has to do some or all of the following tasks: DC Offset compensation, signal presence detection, AGC, frequency offset compensation, symbol synchronization, channel estimation, etc.

In some cases, the timing budgeted for the above tasks, as set forth by the standard, is further shortened due to receiver implementation constraints, such as long PLL settling time, antenna diversity, etc., or specific applications with very strict requirements, such as long sleep intervals without drift correction, large propagation delays, and the like. While the duration for many reception tasks is fairly deterministic and derived from the standard, AGC duration depends on its specific algorithm details and the receiver structure.

In short, AGC duration is a critical element in the sequence of operations that prepare the receiver for proper reception. As illustrated in FIG. 1, present techniques for AGC may involve putting the receiver in certain gain states according to the AGC progression, and doing so without splitting the AGC activity between the I and Q branches. For example, for a certain receiver, AGC may start from the highest gain state that is suitable for achieving sensitivity (longest range). Then according to saturation detection status and/or recognized signal strength indicator ("RSSI") measurement—based on both I and Q branches—processing the next state of the whole receiver is determined. Such techniques are inadequate.

Accordingly, a device and method of fast automatic gain control in quadrature receivers are therefore desired.

SUMMARY

One exemplary embodiment of the disclosed subject matter is a method for fast AGC comprising receiving an input signal, and then splitting the AGC activity between the I and Q branches where in one branch the receive chain is in a certain gain state and in the other branch the receive chain is in a next possible gain state. The next possible gain state may be one or more steps ahead during one AGC time interval. A final receiver gain state is then determined based on input from the I or Q branches. Determining the final receiver gain state may be accomplished using saturation detection or RSSI measurement. Comparators may be used for saturation detection.

Another exemplary embodiment of the disclosed subject matter is a device for fast AGC comprising a quadrature amplitude modulation receiver having an I branch and a Q branch capable of receiving an input signal split to both the I and Q branches; circuitry in the I branch configured to detect a first gain state; circuitry in the Q branch configured to detect a second gain state; and an automated gain control logic configured to determine a final receiver gain state based on input from the I or Q branches. A low noise amplifier may be used to receive the input signal. Both the I and Q branches may include one or more intermediate frequency amplifiers, low pass filters, comparators, and analog to digital converters.

BRIEF DESCRIPTION OF THE DRAWINGS

Some non-limiting exemplary embodiments of the disclosed subject matter are illustrated in the following drawings. Identical or duplicate or equivalent or similar structures, elements, or parts that appear in one or more drawings are generally labeled with the same reference numeral, optionally with an additional letter or letters to distinguish between similar objects or variants of objects, and may not be repeatedly labeled and/or described. Dimensions of components and features shown in the figures are chosen for convenience or clarity of presentation. For convenience or clarity, some elements or structures are not shown or shown only partially and/or with different perspective or from different point of views.

DETAILED DESCRIPTION

A general problem in the field of wireless communications is an amplification or attenuation of the signal power seen at the receiver that results in improper reception. A general solution is to use an AGC mechanism to increase the receiver's dynamic range.

A technical problem in the field of wireless communications is the amount of time a receiver takes to perform the sequence of operations necessary to prepare the receiver for proper reception, including in particular AGC, which is considered to be a primary bottleneck in the reception process. A technical solution implementing the spirit of the disclosed inventions is to split the AGC activity between the I and Q branches where in one branch the receive chain is in a certain gain state and in the other branch the receive chain is in a next possible gain state.

Potential benefits of the general and technical solutions provided by the disclosed subject matter include a simpler and cost-efficient receiver architecture as a result of shortening the AGC duration of any IQ receiver. In particular, in cases where AGC steps are required (for example, large amplitude of required signal and/or interferers, receiver with very small basic dynamic range, etc.), the inventions disclosed herein may advantageously shorten the number of steps by up to 66%, and in some cases even more.

A general nonlimiting overview of practicing the present disclosure is presented below. The overview outlines exemplary practice of embodiments of the present disclosure, providing a constructive basis for variant and/or alternative and/or divergent embodiments, some of which are subsequently described.

Figure 1:
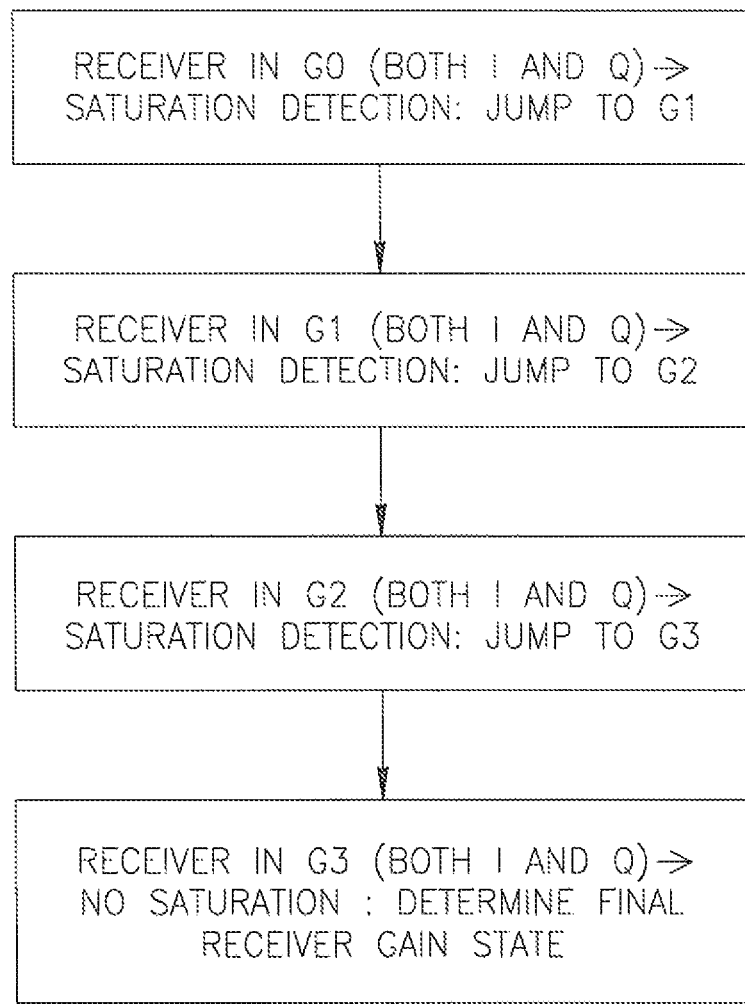
FIG. 1 is a flow chart illustrating the prior art.
Figure 2:
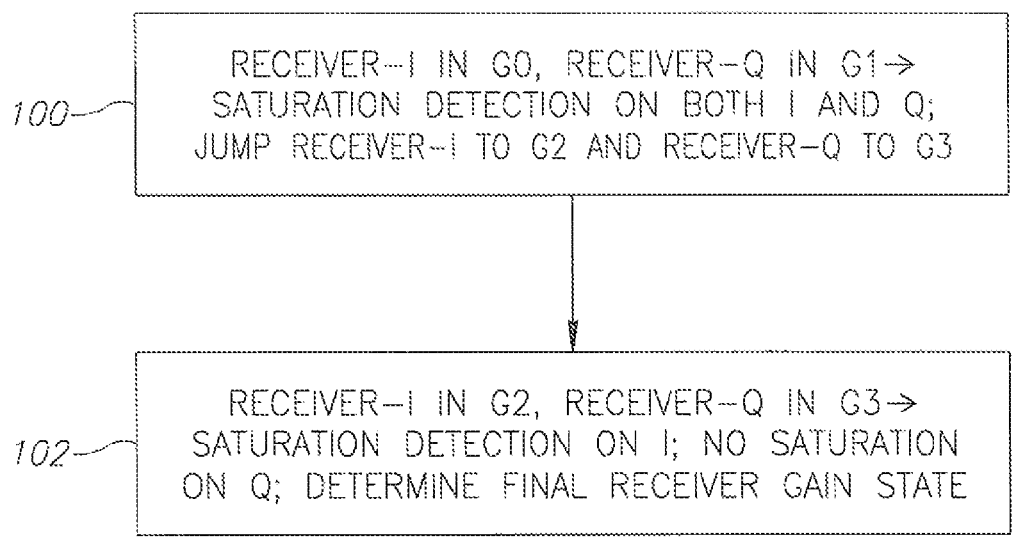
FIG. 2 is a flow chart illustrating an embodiment of the inventions disclosed herein.

FIG. 2 is a flow chart illustrating an embodiment of the inventions disclosed herein in which one branch in the receive chain in a certain gain state and in the other branch the receive chain is in the next possible gain state. As shown in FIG. 2, the next possible gain state is one step ahead; however, the next possible gain state may be more than one step ahead. Turning to FIG. 2, in step 100, Receiver-I is in G0 gain state and Receiver-Q is in G1 gain state. Saturation detection and/or RSSI measurement is then employed on both I and Q. Once detected, Receiver-I jumps to G2 gain state and Receiver-Q jumps to G3 gain state. In step 102, Receiver-I is in G2 gain, state and Receiver-Q is in G3 gain state. Saturation detection and/or RSSI measurement is then employed on both I and Q. Once detected on either I or Q branch, then the final receiver gain state is determined. Comparing FIG. 1 (illustrating typical AGC techniques in which four steps are necessary to determine the final gain state) to FIG. 2, one can see that only two steps are needed to determine the final gain state. While the example of FIG. 2 illustrates 50% of the steps may be saved compared to FIG. 1, when the I and Q branches have gain states two or more steps ahead (rather than one), then 66% or more steps may be saved compared to typical techniques.

Figure 3:
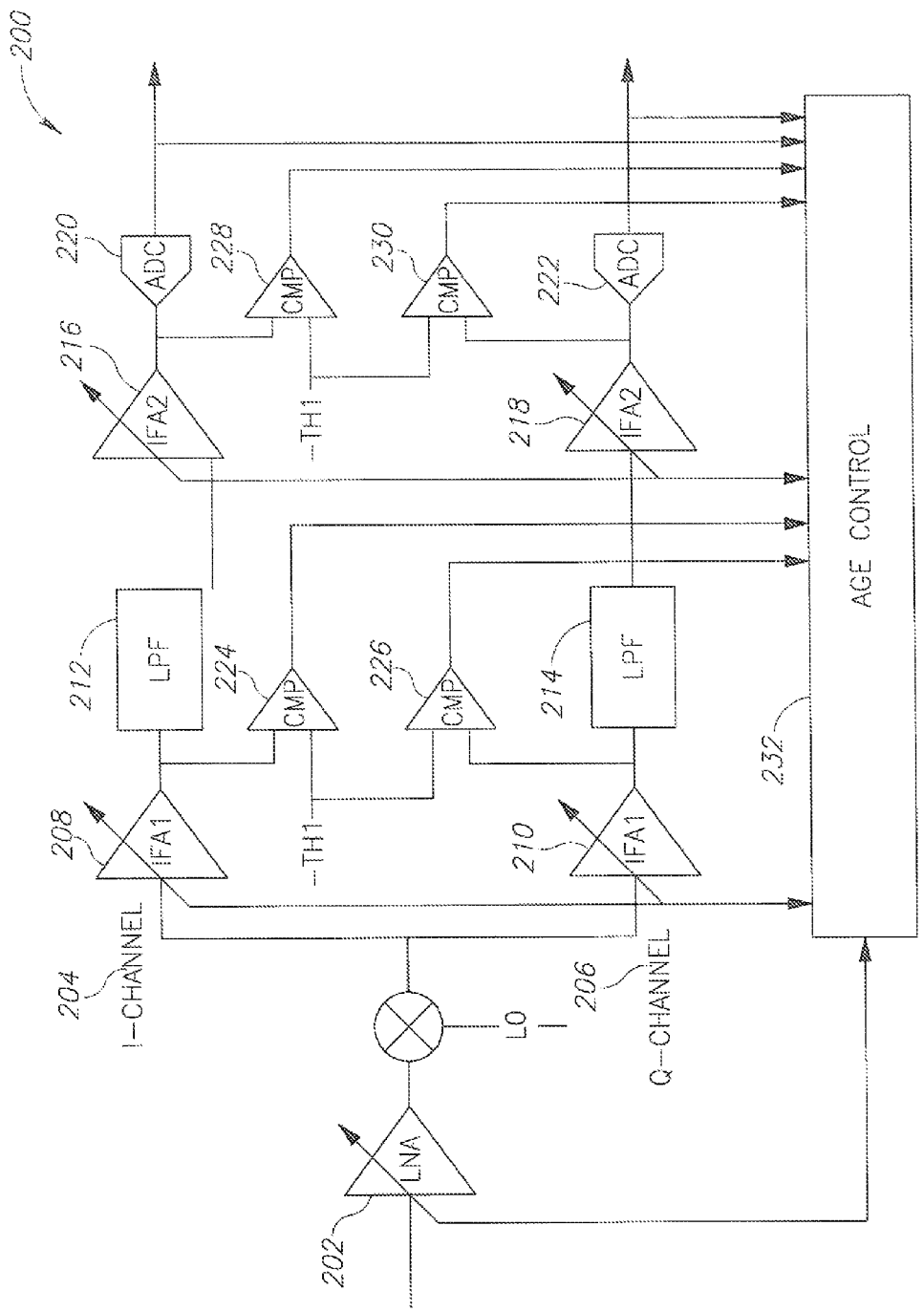
FIG. 3 illustrates an IQ receiver according to an embodiment of the inventions disclosed herein.

FIG. 3 illustrates an exemplary IQ receiver 200 that includes circuitry supporting the disclosed inventions. An input signal is first received by low noise amplifier ("LNA") 202 and then split into an I-channel/I-Receiver 204 and a Q-channel/Q-Receiver 206. From there, the signal travels through respective intermediate frequency amplifiers ("IFA") 208, 210 before reaching respective comparators 224, 226, low pass filters ("LPF") 212, 214, IFAs 216, 218, comparators 228, 230, and analog to digital converters ("ADC") 220, 222. Comparators 224, 226, 228, and 230 are used for saturation, detection. According to the received I and Q signals (ADC 220, 222 outputs) and the saturation detectors' indications (CMP 224, 226 outputs), AGC Control 232 will control the LNA 202 and IFAs 208, 210, 216, 218 gain settings. Contrary to typical AGC techniques that use both I and Q channels in the same setting for each AGC state where the I and Q comparators are actually OR-ed, the inventions disclosed herein shorten the number of AGC steps by referring to I-channel and Q-channel as separate receiving chains, each configured to a different AGC step. In this manner, the disclosed inventions may advantageously be configured to "look ahead" one or more steps of AGC during one AGC time interval. Those skilled in the art will understand that there are myriad options regarding how to implement an AGC algorithm using exemplary AGC mechanism 200. The specific AGC implementation will depend on the particular standard requirements (dynamic range, performance in presence of interferers and blockers, etc.) and/or the selected architecture and design constraints.

While certain embodiments have been described, the embodiments have been presented by way of example only and are not intended to limit the scope of the inventions. Indeed, the novel devices and methods described herein may be embodied in a variety of other forms; furthermore, various omissions, substitutions, and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of fast automatic gain control, the method comprising:
    receiving an input signal;
    splitting the input signal such that the input signal passes through an I branch, and a Q branch of a receiver,
    wherein the I branch is in a certain gain state and the Q branch is in a next possible gain state; wherein the certain gain state differs from the next possible gain state; and
    determining a final receiver gain state based on inputs from the I and Q branches.

2. The method according to claim 1 wherein the next possible gain state is two steps ahead of the certain gain state during one AGC time interval.

3. The method according to claim 1 wherein determining of the final receiver gain state is accomplished using saturation detection or RSSI measurement.

4. The method according to claim 1 wherein the receiving of the input signal comprises receiving the input signal by a low noise amplifier.

5. The method according to claim 4 wherein the I branch includes a first intermediate frequency amplifier and a first comparator for saturation detection, and the Q branch includes a second intermediate frequency amplifier and second comparator for saturation detection.

6. The method according to claim 5 wherein the I branch further includes a low pass filter and the Q branch further includes another low pass filter.

7. The method according to claim 6 wherein the I branch further includes a third intermediate frequency amplifier, a third comparator, and a first analog to digital converter, and wherein the Q branch further includes a fourth intermediate frequency amplifier, a fourth comparator, and a second analog to digital converter.

8. The method according to claim 7, wherein the output from each comparator of the first, second, third and fourth comparators and from each analog to digital converter of the first, second, third and fourth analog to digital converters is sent to an automated gain control logic to control the low noise amplifier and intermediate frequency amplifier gain settings.

9. The method accoprding to claim 1, comprising:
    detecting that both I and Q branches are saturated;
    changing states of the I and Q branches so that the states of the I and Q branches differ from each other and differ from the certain gain state and from the next possible state; and
    determining the final receiver gain state if only one the I and Q branches is saturated.

10. A device for fast automatic gain control, the device comprising:
    a quadrature receiver having an I branch and a Q branch capable of receiving an input signal split to both the I and Q branches; wherein the I branch is arranged to be in a certain gain state while the Q branch is arranged to be in a next possible gain state; wherein the certain gain state differs from the a next possible gain state; and
    an automated gain control logic configured to determine a final receiver gain state based on input from the I and Q branches.

11. The device according to claim 10 wherein the next possible gain state is two steps ahead of the certain gain state during one AGC time interval.

12. The device according to claim 10 wherein the I branch includes a first comparator for saturation detection and the Q branch includes a second intermediate frequency amplifier and second comparator for saturation detection.

13. The device according to claim 12 wherein the I branch further includes a first intermediate frequency amplifier, a low pass filter, a second intermediate frequency amplifier, a second comparator, and an analog to digital converter.

14. The device according to claim 13 wherein the I branch further includes a low pass filter and the Q branch further includes another low pass filter.

15. The device according to claim 14 wherein the I branch further includes a third intermediate frequency amplifier, a third comparator, and a first analog to digital converter, and wherein the Q branch further includes a fourth intermediate frequency amplifier, a fourth comparator, and a second analog to digital converter.

16. The device according to claim 15, wherein an output from each comparator of the first, second, third and fourth comparators and from each analog to digital converter of the first, second, third and fourth analog to digital converters is sent to an automated gain control logic to control low noise amplifier and intermediate frequency amplifier gain settings.

17. The device according to claim 10 wherein determining the final receiver gain state is accomplished using saturation detection or RSSI measurement.

18. The device according to claim 10 wherein the input signal is received by a low noise amplifier.

19. The device according to claim 10 wherein the device is arranged to:
   detect that both I and Q branches are saturated;
   changes states of the I and Q branches so that the states of the I and Q branches differ from each other and differ from the certain gain state and from the next possible state; and
   determine the final receiver gain state if only one the I and Q branches is saturated.

20. A method of fast automatic gain control, the method comprising:
   receiving an input signal;
   splitting the input signal such that the input signal passes through an I branch and a Q branch of receiver,
   wherein the Q branch is in a certain gain state and the I branch is in a next possible gain state; wherein the certain gain state differs from the next possible gain state; and
   determining a final receiver gain state based on inputs from the I and Q branches.

21. A device for fast automatic gain control, the device comprising:
   a quadrature receiver having an I branch and Q branch capable of receiving an input signal split to both the I and Q branches; wherein the Q branch is arranged to be in a certain gain state while the I branch is arranged to be in a next possible gain state; wherein the certain gain state differs from the next possible gain state; and
   an automated gain control logic configured to determine a final receiver gain state based on inputs from the I and Q branches.

* * * * *